(12) United States Patent
Okamoto et al.

(10) Patent No.: US 10,381,082 B2
(45) Date of Patent: Aug. 13, 2019

(54) NONVOLATILE SEMICONDUCTOR STORAGE DEVICE

(71) Applicant: Rohm Co., Ltd., Kyoto (JP)

(72) Inventors: Tsuyoshi Okamoto, Kyoto (JP); Kazuhisa Ukai, Kyoto (JP); Seiichi Yamamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/966,178

(22) Filed: Apr. 30, 2018

(65) Prior Publication Data

US 2018/0315480 A1     Nov. 1, 2018

(30) Foreign Application Priority Data

May 1, 2017    (JP) .................................. 2017-091081

(51) Int. Cl.

| | |
|---|---|
| *G11C 16/04* | (2006.01) |
| *G11C 16/12* | (2006.01) |
| *H01L 27/11521* | (2017.01) |
| *G11C 16/10* | (2006.01) |

(52) U.S. Cl.
CPC .......... *G11C 16/12* (2013.01); *G11C 16/0408* (2013.01); *G11C 16/0416* (2013.01); *G11C 16/10* (2013.01); *H01L 27/11521* (2013.01)

(58) Field of Classification Search
CPC ................ G11C 16/12; G11C 16/0408; H01L 27/11521
See application file for complete search history.

(56) References Cited

U.S. PATENT DOCUMENTS

| | | | | |
|---|---|---|---|---|
| 6,118,706 | A  * | 9/2000 | Smayling | G11C 16/10 |
| | | | | 365/185.11 |
| 6,285,592 | B1 * | 9/2001 | Kubota | G11C 16/3418 |
| | | | | 365/185.18 |
| 2003/0168677 | A1 * | 9/2003 | Hsu | H01L 27/108 |
| | | | | 257/239 |
| 2006/0261401 | A1 * | 11/2006 | Bhattacharyya | B82Y 10/00 |
| | | | | 257/316 |
| 2007/0230251 | A1 | 10/2007 | Ajika et al. | |
| 2008/0225593 | A1 * | 9/2008 | Mitros | G11C 17/04 |
| | | | | 365/185.14 |
| 2008/0273387 | A1 | 11/2008 | Ajika et al. | |
| 2009/0310409 | A1 | 12/2009 | Ajika et al. | |
| 2012/0014181 | A1 | 1/2012 | Ajika et al. | |

FOREIGN PATENT DOCUMENTS

JP           3962769          6/2007

* cited by examiner

*Primary Examiner* — Uyen B Tran
(74) *Attorney, Agent, or Firm* — Fish & Richardson P.C.

(57) ABSTRACT

A nonvolatile semiconductor storage device has floating-gate memory cells and a memory control circuit which controls them. During programming operation of the memory cells, the memory control circuit makes the potentials at the backgate and source of the memory cells equal. For example, during programming operation of the memory cells, the memory control circuit short-circuits together the backgate and source of the memory cells. For another example, during programming operation of the memory cells, the memory control circuit switches from a state where the potentials at the backgate and source of the memory cells are equal to a floating state.

15 Claims, 8 Drawing Sheets

FIG. 4

| FUNCTION | PGM | | | |
|---|---|---|---|---|
| | WRITE"0" | WRITE"1" | SAME BL NONSELECTION | SAME WL NONSELECTION |
| Vs (SL) | VDD (1.5V) → float | VDD (1.5V) → float | VDD (1.5V) → float | VDD (1.5V) → float |
| Vg (WL) | VPL (6-11V step 0.5V) | VPL (6-11V step 0.5V) | VSS (0V) | VPL (6-11V step 0.5V) |
| Vbg (BG) | VPM (4.5V) | VPM (4.5V) | VPM (4.5V) | VPM (4.5V) |
| Vd (BL) | VSS (0V) | float (3.7V) | VSS (0V) | float (3.7V) |
| MEMORY CELL APPLICATION IMAGE | VDD→float, VPL—VPM, VSS | VDD→float, VPL—VPM, float | VDD→float, VSS—VPM, VSS | VDD→float, VPL—VPM, float |
| NOTES | Vdb=4.5V | | Vdb=4.5V | |

| FUNCTION | PGM | | | |
|---|---|---|---|---|
| | WRITE"0" | WRITE"1" | SAME BL NONSELECTION | SAME WL NONSELECTION |
| Vs (SL) | VDD (1.5V) (→float) | VDD (1.5V) (→float) | VDD (1.5V) (→float) | VDD (1.5V) (→float) |
| Vg (WL) | VPM (3-8V step 0.5V) | VPM (3-8V step 0.5V) | VNL (-3V) | VPM (3-8V step 0.5V) |
| Vbg (BG) | VDD (1.5V) | VDD (1.5V) | VDD (1.5V) | VDD (1.5V) |
| Vd (BL) | VNL (-3V) | float (0.7V) | VNL (-3V) | float (0.7V) |
| MEMORY CELL APPLICATION IMAGE | VDD→float, VPM—VDD, VNL | VDD→float, VPM—VDD, float | VDD→float, VNL—VDD, VNL | VDD→float, VPM—VDD, float |
| NOTES | Vdb=4.5V | | Vdb=4.5V | |

FIG. 8
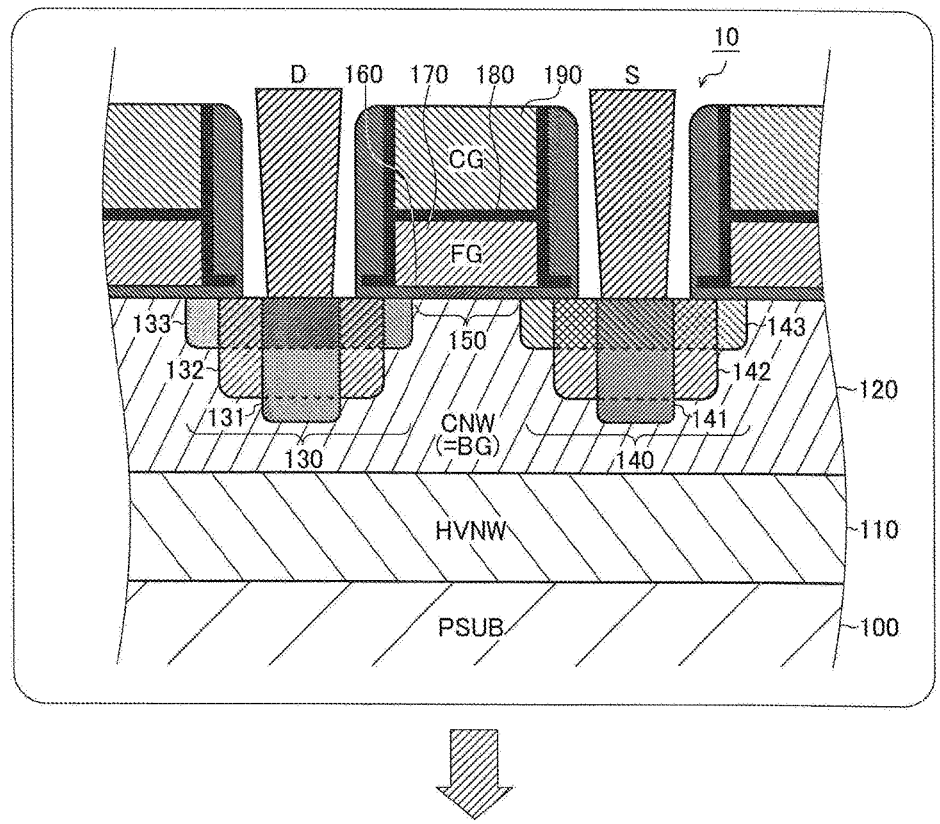
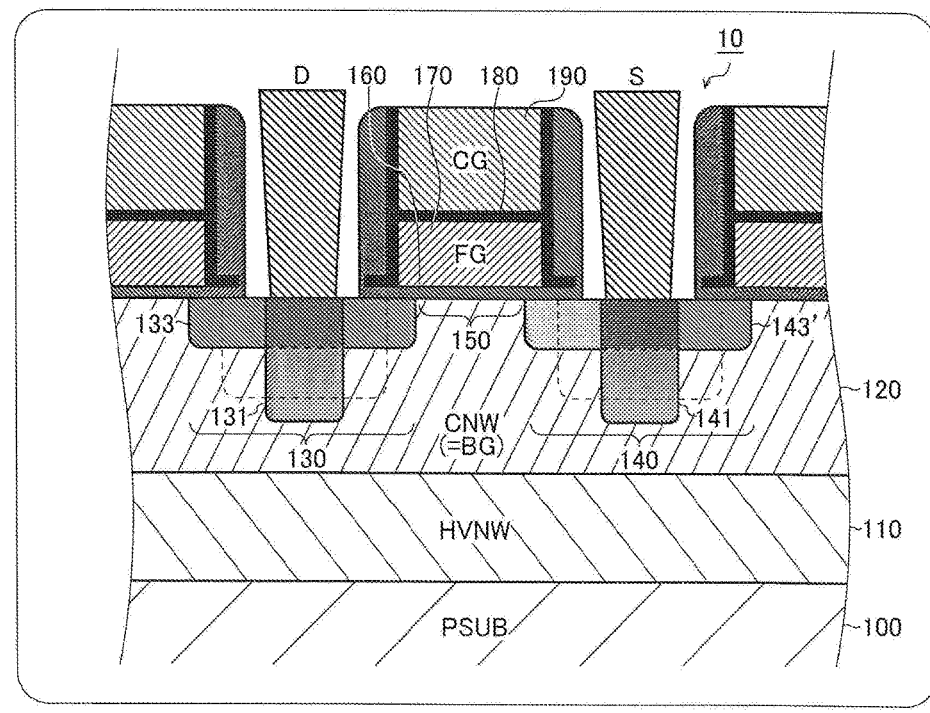

NONVOLATILE SEMICONDUCTOR STORAGE DEVICE

CROSS-REFERENCE TO RELATED APPLICATIONS

This nonprovisional application claims priority under 35 U.S.C. § 119(a) on Patent Application No. 2017-091081 filed in Japan on May 1, 2017, the entire contents of which are hereby incorporated by reference.

BACKGROUND OF THE INVENTION

Field of the Invention

The invention disclosed in this specification relates to a nonvolatile semiconductor storage device.

Description of Related Art

In recent years, nonvolatile semiconductor storage devices such as flash memories are used as storage media of various electronic devices.

Note that there is Japanese Patent No. 3962769 as an example of a conventional technique related to the above description.

However, conventional nonvolatile semiconductor storage devices have room for further improvement against miswriting in a nonselected memory cell.

SUMMARY OF THE INVENTION

In view of the above problem found by the inventors of this application, it is an object of the invention disclosed in this specification to provide a nonvolatile semiconductor storage device capable of preventing miswriting in a nonselected memory cell.

Accordingly, a nonvolatile semiconductor storage device disclosed in this specification includes a floating-gate memory cell, and a memory control circuit arranged to control the memory cell, in which the memory control circuit sets a backgate and a source of the memory cell to the same potential in programming operation of the memory cell.

In addition, a memory control method disclosed in this specification is a method for controlling a floating-gate memory cell forming a nonvolatile semiconductor storage device. The memory control method includes setting a backgate and a source of the memory cell to the same potential in programming operation of the memory cell.

Note that other features, elements, steps, advantages, and characteristics of the present invention will become more apparent from the description of the best mode embodiment given below and the related attached drawings.

BRIEF DESCRIPTION OF THE DRAWINGS

FIG. 4 is a list of voltages applied to selected and nonselected memory cells in the programming operation.

FIG. 8 is a vertical cross-sectional view illustrating a third structural example of the memory cell.

DETAILED DESCRIPTION OF THE PREFERRED EMBODIMENTS

<Nonvolatile Semiconductor Storage Device>

Figure 1:
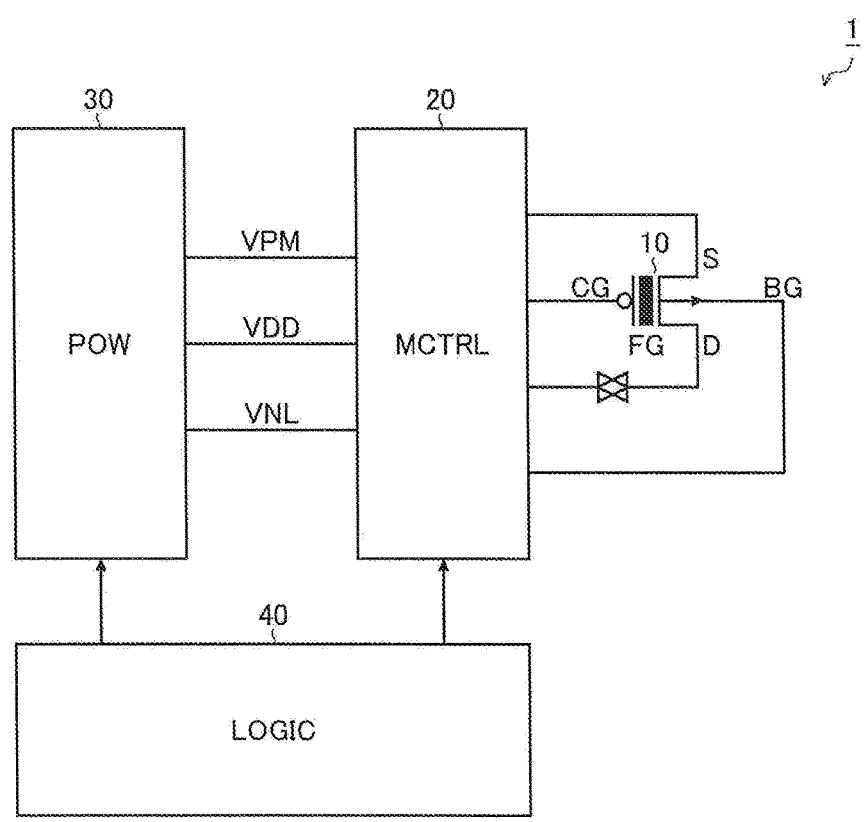
FIG. 1 is a diagram illustrating a schematic structure of a nonvolatile semiconductor storage device.

FIG. 1 is a diagram illustrating a schematic structure of a nonvolatile semiconductor storage device. A nonvolatile semiconductor storage device 1 of this structural example is a flash memory (i.e. one type of an electrically erasable programmable read-only memory (EEPROM)) in which data can be electrically erased and written, and includes memory cells 10, a memory control circuit 20, a power supply circuit 30, and a logic circuit 40.

The memory cell 10 is a memory element that stores one bit data ("0" or "1"), and in the example of this diagram, a P-channel metal oxide semiconductor field effect transistor (PMOSFET) including a floating gate FG is used as the memory cell 10. The source S, the drain D, the control gate CG, and the backgate BG of the memory cell 10 are each connected to the memory control circuit 20. Note that in this diagram, for convenience sake of illustration, only one memory cell 10 is shown, but actually a plurality of memory cells 10 are arranged in an array (i.e. in a two-dimensional matrix).

The memory control circuit 20 operates with power supplied from the power supply circuit 30, and controls voltages (i.e. a source voltage Vs, a drain voltage Vd, a gate voltage Vg, and a backgate voltage Vbg) applied to individual portions of the memory cell 10 (i.e., the source S, the drain D, the control gate CG, and the backgate BG). Note that a specific structure of the memory control circuit 20 is not described in detail, but for example, it is configured using a XY cross pointer that designates an XY matrix position of the selected memory cell (i.e. the memory cell to be accessed), a row decoder connected to a word line WL (i.e. the control gate CG of the memory cell 10), a column decoder connected to a source line SL (i.e. the source S of the memory cell 10), a sense amplifier connected to a bit line BL (i.e. the drain D of the memory cell 10) and the like (which are not illustrated).

The power supply circuit 30 supplies powers to individual portions of the nonvolatile semiconductor storage device 1. For example, the power supply circuit 30 supplies the memory control circuit 20 with a plurality of voltages necessary for programming operation of the memory cell 10, which are a power supply voltage VDD (i.e. corresponding to a first voltage, and VDD=1.5 V, for example), a negative voltage VNL (i.e. corresponding to a second voltage, and VNL=−3 V, for example), and a positive voltage VPM (i.e. corresponding to a third voltage, and VPM=3 to 8 V, for example). Note that a specific structure of the power supply circuit 30 is not described in detail, but for example, it is configured using a regulator having positive and negative outputs, a charge pump having positive and negative outputs, a bandgap reference voltage source, and the like (which are not illustrated).

The logic circuit 40 operates with power supplied from the power supply circuit 30, and integrally controls the memory control circuit 20 and the power supply circuit 30.

<Basic Operation>

In the nonvolatile semiconductor storage device 1 of this structural example, an on-threshold voltage of the memory cell 10 is changed depending on whether or not charge is stored in the floating gate FG.

More specifically, when charge is stored in the floating gate FG of the memory cell 10, the on-threshold voltage of the memory cell 10 becomes high, and hence current does not easily flow to the memory cell 10. This state corresponds to a state where data "0" is written in the memory cell 10.

In contrast, when charge is not stored in the floating gate FG of the memory cell 10, the on-threshold voltage of the memory cell 10 becomes low, and hence current easily flow to the memory cell 10. This state corresponds to a state where data "1" is written in the memory cell 10 (i.e. a state where data "0" is erased in the memory cell 10).

Therefore in reading operation (and verifying operation) of the memory cell 10, it is checked whether or not reading current (i.e. drain current) flows to the memory cell 10 using the sense amplifier, and hence data ("0" or "1") can be read from the memory cell 10.

Note that in reading operation of the memory cell 10, it is checked whether or not reading current flows using the sense amplifier when a potential difference between source and control gate of the memory cell 10 (=Vs−Vg) is set to −5.7 V, a potential difference between source and backgate (=Vs−Vbg) is set to 0 V, and the drain is set to a floating state, for example. The potential difference between source and control gate described above is a potential difference necessary for data determination (i.e. 0 or 1 determination) by the sense amplifier.

In addition, the verifying operation of the memory cell 10 is basically the same as the reading operation, but it is necessary to set the potential difference between source and control gate of the memory cell 10 to −3.7 V, for example, in program verifying operation, and to set the potential difference to −6.5 V, for example, in erase verifying operation.

On the other hand, when performing the programming operation of the memory cell 10 (i.e. operation of injecting charge into the floating gate FG so as to write data "0"), it is necessary, before the operation, to perform erasing operation of the memory cell 10 (i.e. operation of eliminating charge from the floating gate FG so as to erase data "0" (i.e. operation of restoring data "1")).

When performing the erasing operation of the memory cell 10, a potential difference between backgate and control gate (=Vbg−Vg) is set to 21.6 V, and a potential difference between backgate and drain (=Vbg−Vd) and a potential difference between backgate and source (=Vbg−Vs) are each set to 0 V, for example. The former is a potential difference necessary for generating Fowler-Nordheim (FN) tunnel current, and the latter is a potential difference necessary for preventing inhibition of maintaining a BG potential. By applying the voltages as described above, charge is eliminated from the floating gate FG of the memory cell 10, and the on-threshold voltage of the memory cell 10 is decreased.

Note that the potential difference between backgate and control gate described above may be increased step by step within a range of 15.4 to 21.6 V, for example, while sequentially performing the erase verifying operation.

In addition, the erasing operation of the memory cell 10 is performed not for each memory cell 10 but for a group of memory cells formed in a common cell well (e.g. memory cells of 64 pages or 128 pages) as one block, simultaneously by block unit.

<Programming Operation>

Figure 2:
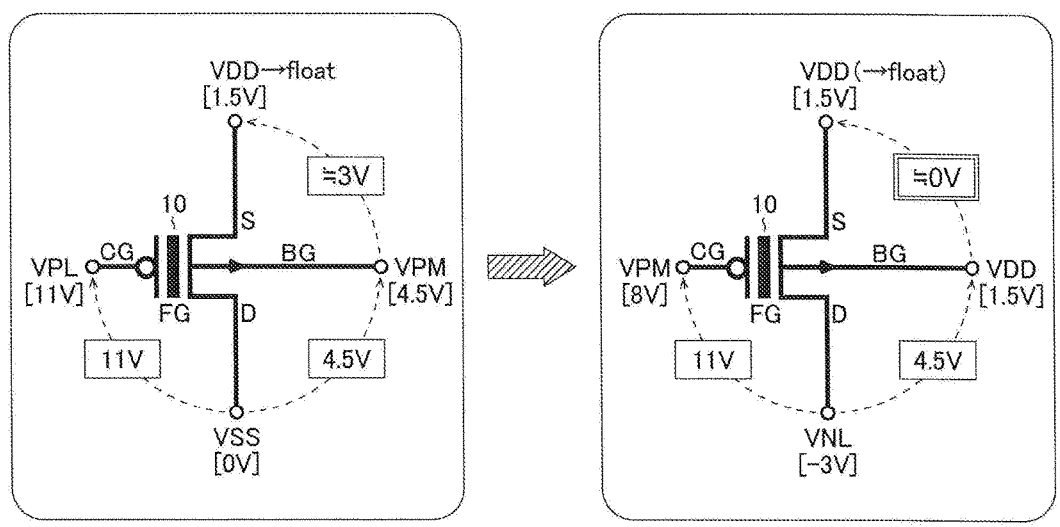
FIG. 2 is a diagram illustrating voltages applied to a selected memory cell in programming operation.

Next, the programming operation of the memory cell 10 is described with reference to FIG. 2. FIG. 2 is a diagram illustrating voltages applied to the memory cell 10 in the programming operation, and in this diagram, only the selected memory cell, in which data "0" is to be written among the plurality of memory cells 10, is illustrated as an example. Note that one example of conventional apply voltage control is illustrated in a left frame of this diagram, and one example of new apply voltage control adopted in the memory control circuit 20 is illustrated in a right frame of this diagram.

In the programming operation of the memory cell 10, in order to inject charge into the floating gate FG of the memory cell 10, a potential difference between control gate and drain (=Vg−Vd) is set to 11 V, and the potential difference between backgate and drain (=Vbg−Vd) is set to 4.5 V, for example. The former is a potential difference necessary for inducing charge to the floating gate FG, and the latter is a potential difference necessary for generating tunnel electrons. By applying the voltages as described above, charge is injected into the floating gate FG of the memory cell 10, and the on-threshold voltage of the memory cell 10 is increased.

Note that the potential difference between control gate and drain described above may be increased step by step within a range of 6 to 11 V, for example, while sequentially performing the program verifying operation.

In the conventional apply voltage control, as illustrated in the left frame of this diagram, a ground voltage VSS (=0 V) is applied to the drain D, the positive voltage VPM (=4.5 V) that is higher than the ground voltage VSS (=0 V) by 4.5 V is applied to the backgate BG, a positive voltage VPL (=11 V) that is higher than the ground voltage VSS (=0 V) by 11 V is applied to the control gate CG, and the source S of the memory cell 10 is switched to the floating state from a state where the power supply voltage VDD (=1.5 V) is applied thereto.

In other words, in the conventional apply voltage control, an unnecessary potential difference (approximately 3 V) is generated as the potential difference between backgate and source (=Vbg−Vs) of the memory cell 10. This unnecessary potential difference is generated not only in the memory cell in which data "0" is to be written (i.e. the selected memory cell) but also in the memory cell in which data "0" is not to be written (i.e. a nonselected memory cell) in the same manner. Therefore in the conventional apply voltage control, miswriting in the nonselected memory cell (i.e. unintended writing of data "0") may be caused.

Therefore, the memory control circuit 20 adopts new apply voltage control that can solve the above-mentioned problem. More specifically, in the new apply voltage control proposed in this specification, as illustrated in the right frame of this diagram, the backgate BG and the source S of the memory cell 10 are set to the same potential (the power supply voltage VDD (=1.5 V) in this diagram) in the programming operation of the memory cell 10.

By adopting this apply voltage control, in the programming operation of the memory cell 10, regardless of a selected or nonselected state thereof, the potential difference between backgate and source of the memory cell 10 can be 0 V (or substantially 0 V). Therefore miswriting in the nonselected memory cell can be prevented.

In addition, in the programming operation of the memory cell 10, voltage reduction is not necessary by setting the backgate BG and the source S of the memory cell 10 to the same potential, and hence mask layers in the memory cell 10 can be reduced (details will be described later).

Note that as a method of setting the backgate BG and the source S of the memory cell 10 to the same potential, it is easiest and most reliable to short-circuit the backgate BG and the source S of the memory cell 10.

However, the method of setting the backgate BG and the source S of the memory cell 10 to the same potential is not limited to the above-mentioned method. For example, it is possible to apply the power supply voltage VDD to each of the source S and the backgate BG of the memory cell 10, and from this state, to switch the source S of the memory cell 10 to the floating state in the same manner as the conventional apply voltage control.

In addition, in the conventional apply voltage control, the positive voltage VPM of the backgate BG (=VSS+4.5 V) and the positive voltage VPL of the control gate CG (=VSS+ 11 V) are set with reference to the ground voltage VSS (=0 V) applied to the drain D of the memory cell 10.

In contrast, in the new apply voltage control, the power supply voltage VDD (=1.5 V), which is applied to each of the source S and the backgate BG of the memory cell 10, is used as a reference, so as to set the negative voltage VNL of the drain D (=−3 V=VDD−4.5 V) and the positive voltage VPM of the control gate CG (=8 V=VNL+11 V=VDD+6.5 V).

As a result, compared with the conventional apply voltage control, in the new apply voltage control, applied voltages to individual portions of the memory cell 10 are shifted to the low potential side by −3 V each (Vg is shifted from 11 V to 8 V, Vd is shifted from 0 V to −3 V, and Vbg is shifted from 4.5 V to 1.5 V).

This shifting of applied voltages by −3 V enables reduction of high withstand voltage elements in the memory control circuit 20 (in particular the XY cross pointer, the row decoder, and the like), and reduction of regulators (VPL_REG) in the power supply circuit 30 (details will be described later).

In addition, because the positive voltage VPM (=VDD+ 6.5 V) and the negative voltage VNL (=VDD−4.5 V) are generated with reference to the power supply voltage VDD (=1.5 V), it is possible to reduce fluctuation or variation in the applied voltage in the programming operation of the memory cell 10.

Note that in the power supply circuit 30, a negative output charge pump or a negative output regulator is disposed as means for generating negative voltages used for the reading operation and the verifying operation. Therefore the negative voltage VNL (=−3 V) is generated by using the above-mentioned negative voltages.

<Prevention of Miswriting>

Next, prevention of miswriting in the nonselected memory cell by the above-mentioned new apply voltage control is described in detail with reference to FIGS. 3 and 4.

Figure 3:
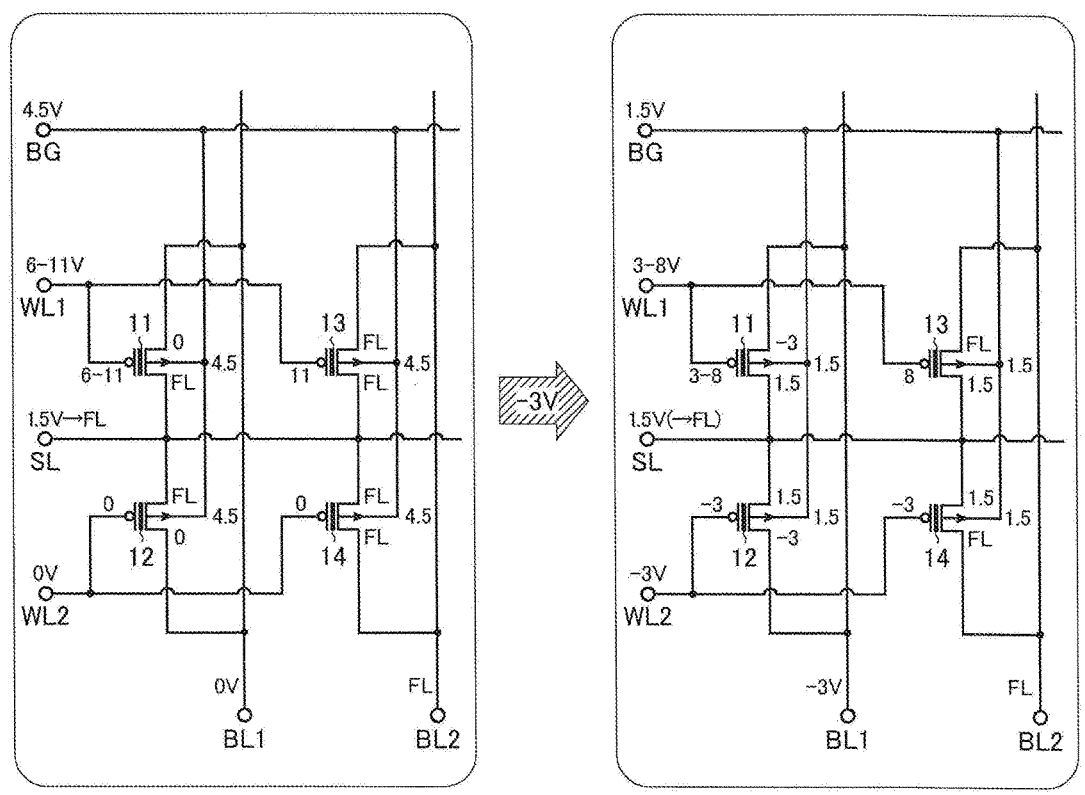
FIG. 3 is a diagram illustrating voltages applied to selected and nonselected memory cells in the programming operation.

FIGS. 3 and 4 are a circuit diagram and a list showing voltages applied to the selected and nonselected memory cells in the programming operation. Note that a left frame in FIG. 3 and an upper part in FIG. 4 show one example of the conventional apply voltage control, while a right frame in FIG. 3 and a lower part in FIG. 4 show one example of the new apply voltage control adopted in the memory control circuit 20.

In addition, in the following description, the four memory cells 11 to 14 illustrated in FIG. 3 may be differentiated as the selected memory cell 11, the same BL nonselected memory cell 12, the same WL nonselected memory cell 13, and the other nonselected memory cell 14. In addition, the memory cells 12 to 14 other than the selected memory cell 11 may be collectively referred to as the nonselected memory cells 12 to 14.

The selected memory cell 11 is the memory cell in which data "0" is to be written. The control gate of the selected memory cell 11 is connected to a word line WL1. The drain of the selected memory cell 11 is connected to a bit line BL1. The source of the selected memory cell 11 is connected to the source line SL.

The same BL nonselected memory cell 12 is the memory cell in which data "0" is not to be written though connected to the same bit line BL1 as the selected memory cell 11. The control gate of the same BL nonselected memory cell 12 is connected to a word line WL2. The drain of the same BL nonselected memory cell 12 is connected to the bit line BL1. The source of the same BL nonselected memory cell 12 is connected to the source line SL.

The same WL nonselected memory cell 13 is the memory cell in which data "0" is not to be written though connected to the same word line WL1 as the selected memory cell 11. The control gate of the same WL nonselected memory cell 13 is connected to the word line WL1. The drain of the same WL nonselected memory cell 13 is connected to a bit line BL2. The source of the same WL nonselected memory cell 13 is connected to the source line SL.

The other nonselected memory cell 14 is connected to the same source line SL as the selected memory cell 11, but it is the memory cell in which data "0" is not to be written, which is not connected to either the bit line BL1 or the word line WL1. The control gate of the other nonselected memory cell 14 is connected to the word line WL2. The drain of the other nonselected memory cell 14 is connected to the bit line BL2. The source of the other nonselected memory cell 14 is connected to the source line SL.

In addition, the four memory cells 11 to 14 are all formed in the same cell well, and hence they have the common backgate BG.

Note that FIG. 3 illustrates the manner in which two memory cells are connected to each of the bit lines BL1 and BL2, but actually, many (e.g. 32 or 64) memory cells are connected to one bit line so as to form a string.

In addition, in each string, neighboring memory cells (e.g. the selected memory cell 11 and the same BL nonselected memory cell 12) have a common source area and a common drain area. With this structure, a degree of integration of the memory cell array can be enhanced, so that storage capacity per unit area can be increased, resulting in reduced cost of the nonvolatile semiconductor storage device 1.

In addition, FIG. 3 illustrates the manner in which two memory cells are connected to each of the word lines WL1 and WL2, but actually, many (e.g. 16 k or 32 k) memory cells are connected to one word line so as to form a page. Note that the memory control circuit 20 performs the programming operation by page unit (2 k byte or 4 k byte) of this.

Next, with reference to the left frame in FIG. 3, the conventional apply voltage control is described. In the programming operation, the source line SL is switched to the floating state from the state where the power supply voltage VDD (=1.5 V) is applied. The word line WL1 is applied with the positive voltage VPL (i.e. 6 to 11 V) step by step of 0.5 V. Each of the word line WL2 and the bit line BL1 is applied with the ground voltage VSS (=0 V). The bit line BL2 is set to the floating state. In addition, the backgate BG of each of the memory cells 11 to 14 is applied with the positive voltage VPM (=4.5 V).

The selected memory cell 11 is noted. As shown in the column of "WRITE "0"" of the upper part in FIG. 4, the source voltage Vs is switched from the power supply voltage VDD (=1.5 V) to the floating state, the positive voltage VPL (i.e. 6 to 11 V) is applied as the gate voltage Vg, the positive voltage VPM (=4.5 V) is applied as the backgate voltage Vbg, and the ground voltage VSS (=0 V) is applied as the drain voltage Vd.

The same BL nonselected memory cell 12 is noted. As shown in the column of "same BL nonselected" of the upper part in FIG. 4, the source voltage Vs is switched from the power supply voltage VDD (=1.5 V) to the floating state, the ground voltage VSS (=0 V) is applied as the gate voltage Vg, the positive voltage VPM (=4.5 V) is applied as the backgate voltage Vbg, and the ground voltage VSS (=0 V) is applied as the drain voltage Vd.

The same WL nonselected memory cell 13 is noted. As shown in the column of "same WL nonselected" (or the column of "WRITE "1"") of the upper part in FIG. 4, the source voltage Vs is switched from the power supply voltage VDD (=1.5 V) to the floating state, the positive voltage VPL (i.e. 6 to 11 V) is applied as the gate voltage Vg, the positive voltage VPM (=4.5 V) is applied to the backgate voltage Vbg, and the drain voltage Vd is set to the floating state (=3.7 V=Vth"0"+Vg).

In addition, the other nonselected memory cell 14 is automatically determined from conditions of applied voltages to the same BL nonselected memory cell 12 and to the same WL nonselected memory cell 13. More specifically, the source voltage Vs is switched from the power supply voltage VDD (=1.5 V) to the floating state, the ground voltage VSS (=0 V) is applied as the gate voltage Vg, the positive voltage VPM (=4.5 V) is applied as the backgate voltage Vbg, and the drain voltage Vd is set to the floating state (=3.7 V=Vth"0"+Vg).

In this way, in the conventional apply voltage control, the unnecessary potential difference (approximately 3 V) is generated as the potential difference between backgate and source (=Vbg−Vs) of each of the nonselected memory cells 12 to 14, and hence miswriting may occur.

Next, with reference to the right frame in FIG. 3, the new apply voltage control by the memory control circuit 20 is described in detail. In the programming operation, the source line SL is applied with the power supply voltage VDD (=1.5 V). However, similarly to the conventional apply voltage control, it is possible to switch the source line SL to the floating state. The word line WL1 is applied with the positive voltage VPL (i.e. 3 to 8 V) step by step of 0.5 V. Each of the word line WL2 and the bit line BL1 is applied with the negative voltage VNL (=−3 V). The bit line BL2 is set to the floating state. In addition, the backgate BG of each of the memory cells 11 to 14 is applied with the power supply voltage VDD (=1.5 V).

The selected memory cell 11 is noted. As shown in the column of "WRITE "0"" of the lower part in FIG. 4, the power supply voltage VDD (=1.5 V) is applied as the source voltage Vs, the positive voltage VPM (i.e. 3 to 8 V) is applied as the gate voltage Vg, the power supply voltage VDD (=1.5 V) is applied as the backgate voltage Vbg, and the negative voltage VNL (=−3 V) is applied as the drain voltage Vd.

In this way, in the selected memory cell 11, the potential difference between control gate and drain (=Vg−Vd) is set to 11 V, and the potential difference between backgate and drain (=Vbg−Vd) is set to 4.5 V. Note that the former is a potential difference necessary for inducing charge to the floating gate FG, and the latter is a potential difference necessary for generating tunnel electrons.

The same BL nonselected memory cell 12 is noted. As shown in the column of "same BL nonselected" of the lower part in FIG. 4, the power supply voltage VDD (=1.5 V) is applied as the source voltage Vs, the negative voltage VNL (=−3 V) is applied as the gate voltage Vg, the power supply voltage VDD (=1.5 V) is applied as the backgate voltage Vbg, and the negative voltage VNL (=−3 V) is applied as the drain voltage Vd.

In this way, in the same BL nonselected memory cell 12, the potential difference between control gate and drain (=Vg−Vd) is set to 0 V or lower. This is a potential difference necessary for preventing drain disturb (i.e. injection of hot carriers into the floating gate FG), and in this diagram, the gate voltage Vg and the drain voltage Vd are set to the same potential (=−3 V).

The same WL nonselected memory cell 13 is noted. As shown in the column of "same WL nonselected" (or in the column of "WRITE "1"") of the lower part in FIG. 4, the power supply voltage VDD (=1.5 V) is applied as the source voltage Vs, the positive voltage VPM (i.e. 3 to 8 V) is applied as the gate voltage Vg, the power supply voltage VDD (=1.5 V) is applied as the backgate voltage Vbg, and the drain voltage Vd is set to the floating state (=0.7 V=Vth"0"+Vg).

In this way, in the same WL nonselected memory cell 13, the drain is set to the floating state. This is a state necessary for preventing generation of tunnel electrons.

In addition, the other nonselected memory cell 14 is automatically determined from conditions of applied voltages to the same BL nonselected memory cell 12 and to the same WL nonselected memory cell 13. More specifically, the power supply voltage VDD (=1.5 V) is applied as the source voltage Vs, the negative voltage VNL (=−3 V) is applied as the gate voltage Vg, the power supply voltage VDD (=1.5 V) is applied as the backgate voltage Vbg, and the drain voltage Vd is set to the floating state (=0.7 V=Vth"0"+Vg).

As described above, as to the selected memory cell 11 among the plurality of memory cells 10, the memory control circuit 20 sets the backgate and the source to the power supply voltage VDD (i.e. corresponding to the first voltage), sets the drain to the negative voltage VNL (i.e. corresponding to the second voltage) lower than the power supply voltage VDD, and sets the control gate to the positive voltage VPM (i.e. corresponding to the third voltage) higher than the power supply voltage VDD.

In addition, as to the same BL nonselected memory cell 12 among the plurality of memory cells 10, the memory control circuit 20 sets the backgate and the source to the power supply voltage VDD, and sets the drain and the control gate to the negative voltage VNL.

In addition, as to the same WL nonselected memory cell 13 among the plurality of memory cells 10, the memory control circuit 20 sets the backgate and the source to the power supply voltage VDD, sets the control gate to the positive voltage VPM, and sets the drain to the floating state.

In this way, by adopting the new apply voltage control in the memory control circuit 20, the potential difference between backgate and source (=Vbg−Vs) of each of the nonselected memory cells 12 to 14 can be 0 V (or substantially 0 V). Therefore miswriting in the nonselected memory cells 12 to 14 in the programming operation can be prevented.

<Reduction of High Withstand Voltage Elements>

Figure 5:
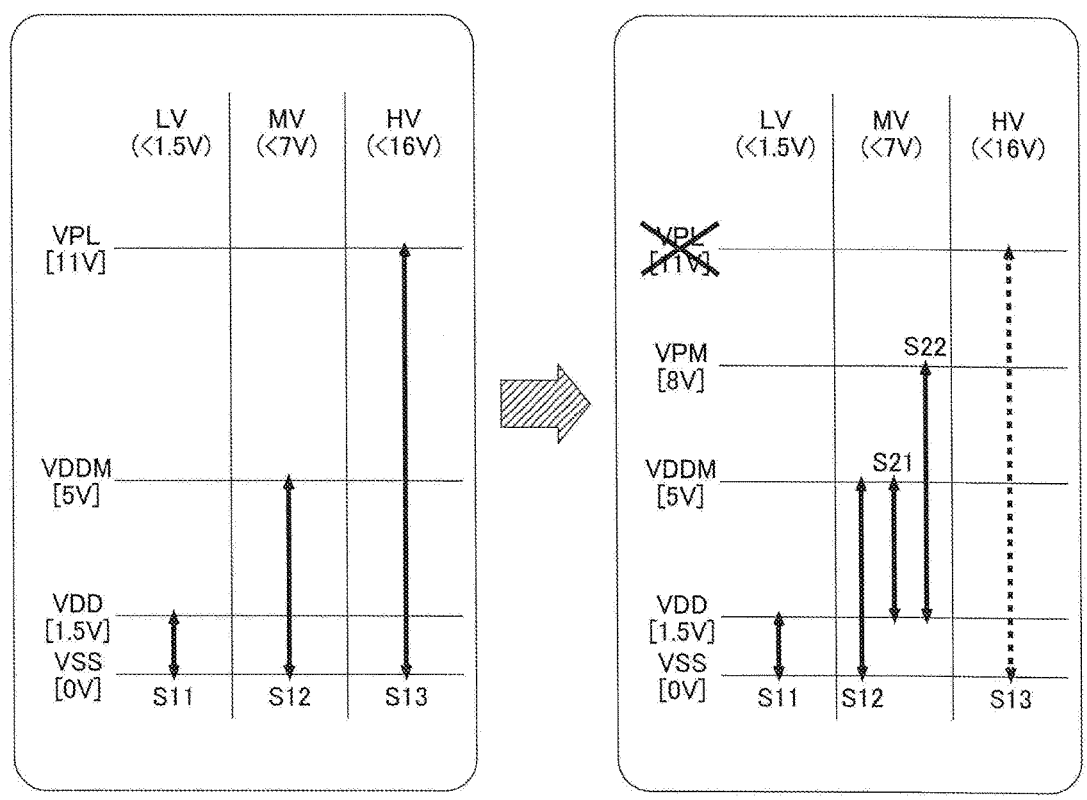
FIG. 5 is a diagram illustrating one example of signal level shift.

Next, reduction of high withstand voltage elements in the memory control circuit 20 (in particular, the row decoder that drives the gate voltage Vg) is described with reference to FIG. 5. FIG. 5 is a diagram illustrating one example of signal level shift inside the memory control circuit 20. Note that a left frame in FIG. 5 illustrates a manner of signal level shift necessary for performing the conventional apply voltage control, and a right frame in FIG. 5 illustrates a manner of signal level shift necessary for performing the new apply voltage control.

In addition, in the following description, an element having a withstand voltage of 1.5 V or lower is referred to as a low withstand voltage element LV, an element having a withstand voltage of 7 V or lower is referred to as a medium withstand voltage element MV, and an element having a withstand voltage of 16 V or lower is referred to as a high withstand voltage element HV. Further, when thicknesses of tunnel insulation films of the elements (Tox(LV), Tox(MV), and Tox(HV)) are noted, the relationship of Tox(LV)<Tox(MV)<Tox(HV) is satisfied.

In the conventional apply voltage control, in order to apply the gate voltage Vg of maximum 11 V to the control gate CG of the memory cell 10, as illustrated in the left frame of this diagram, it is necessary to level shift a control signal S11 driven between the power supply voltage VDD (=1.5 V) and the ground voltage VSS (=0 V) (i.e. an input signal from the logic circuit 40) so as to generate a control signal S12 driven between a positive voltage VDDM (=5 V) and the ground voltage VSS (=0 V), and further to level shift the same so as to generate a control signal S13 (i.e. a drive signal of the row decoder) driven between the positive voltage VPL (=11 V) and the ground voltage VSS (=0 V).

The element applied with the control signal S11 is sufficient to withstand a potential difference (=VDD−VSS) of 1.5 V, and hence the low withstand voltage element LV can be used as the element. In addition, the element applied with the control signal S12 is sufficient to withstand a potential difference (=VDDM−VSS) of 5 V, and hence the medium withstand voltage element MV can be used as the element. However, the element applied with the control signal S13 is required to withstand a potential difference (=VPL−VSS) of 11 V, and hence the high withstand voltage element HV must be used as the element.

On the other hand, in the new apply voltage control, in order to apply the gate voltage Vg of maximum 8 V to the control gate CG of the memory cell 10, as illustrated in the right frame of this diagram, after generating the control signal S12 from the control signal S11 in the same manner as described above, the control signal S12 is level shifted so as to generate a control signal S21 driven between the positive voltage VDDM (=5 V) and the power supply voltage VDD (=1.5 V), and this is further level shifted so as to generate a control signal S22 driven between the positive voltage VPM (=8 V) and the power supply voltage VDD (=1.5 V).

As to the elements applied with the control signals S11 and S12, respectively, it is sufficient to use the low withstand voltage element LV and the medium withstand voltage element MV, respectively, in the same manner as described above. In addition, the element applied with the control signal S21 is sufficient to withstand a potential difference (=VDDM−VDD) of 3.5 V, and hence the medium withstand voltage element MV can be used as the element. In addition, the element applied with the control signal S22 is sufficient to withstand a potential difference (=VPM−VDD) of 6.5 V, and hence the medium withstand voltage element MV can be used as the element.

In this way, by adopting the new apply voltage control in the memory control circuit 20, although the number of stages of the level shifts is increased by one, the high withstand voltage element HV can be replaced with the medium withstand voltage element MV having a smaller size. Therefore shrinking of the memory control circuit 20 can be achieved. In addition, the regulator (VPL_REG) that generates the positive voltage VPL becomes unnecessary, and hence shrinking of the power supply circuit 30 can also be achieved.

Note that the negative voltage VNL (=−3 V) applied to the drain of the memory cell 10 is a voltage handled by the sense amplifier, and it is not applied to an element forming the row decoder. Therefore in withstand voltage design of the row decoder, it is not necessary to consider the potential difference (=VPM−VNL) between the positive voltage VPM (=8 V) and the negative voltage VNL (=−3 V).

In addition, applied voltage conditions in the programming operation (or in the erasing operation) are different from applied voltage conditions in the reading operation or in the verifying operation, and it is not necessary to review the operating point of the sense amplifier when changing the conditions. Therefore it can be said to be relatively low risk.

<Reduction of Mask Layers>

Figure 6:
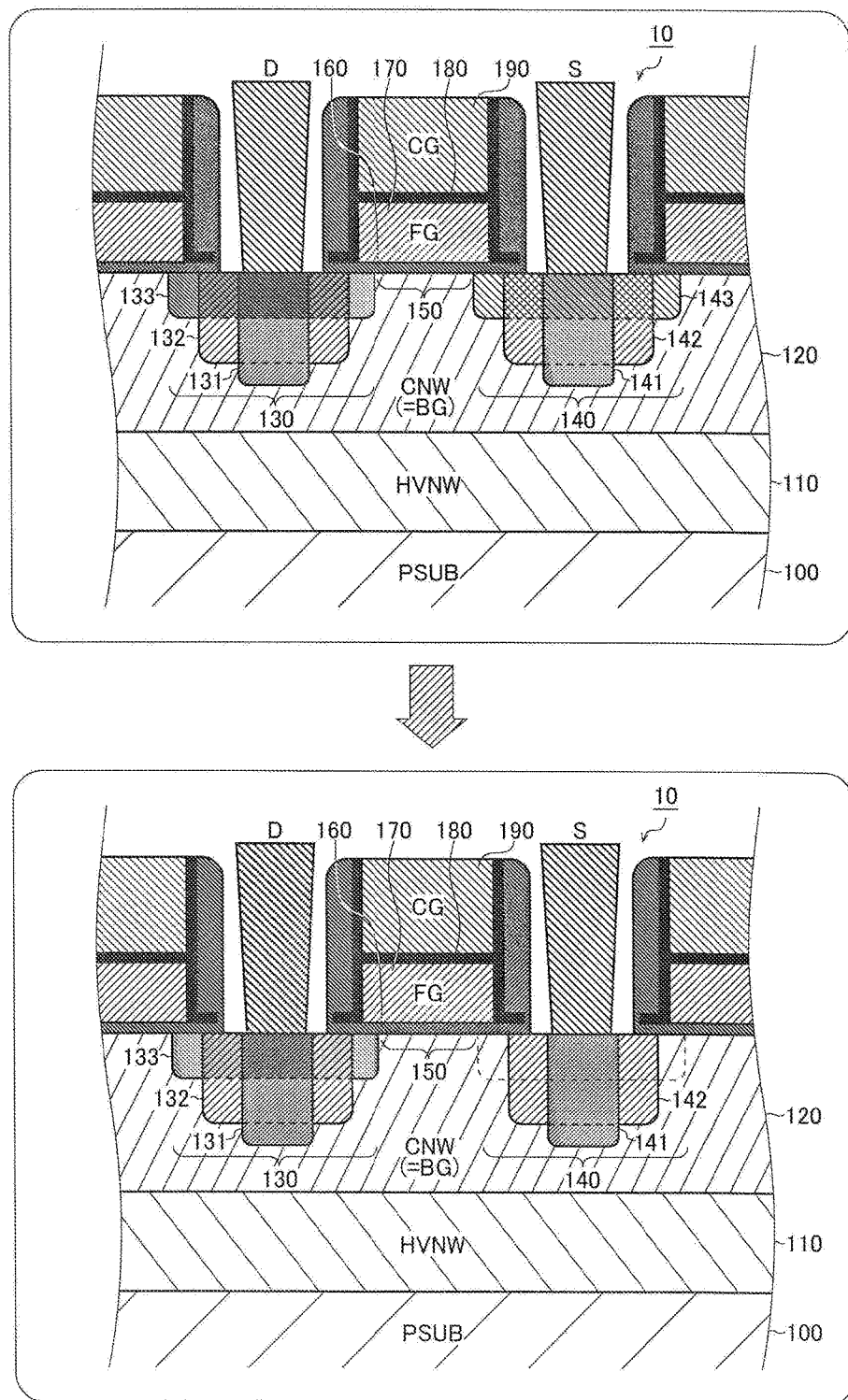
FIG. 6 is a vertical cross-sectional view illustrating a first structural example of the memory cell.
Figure 7:
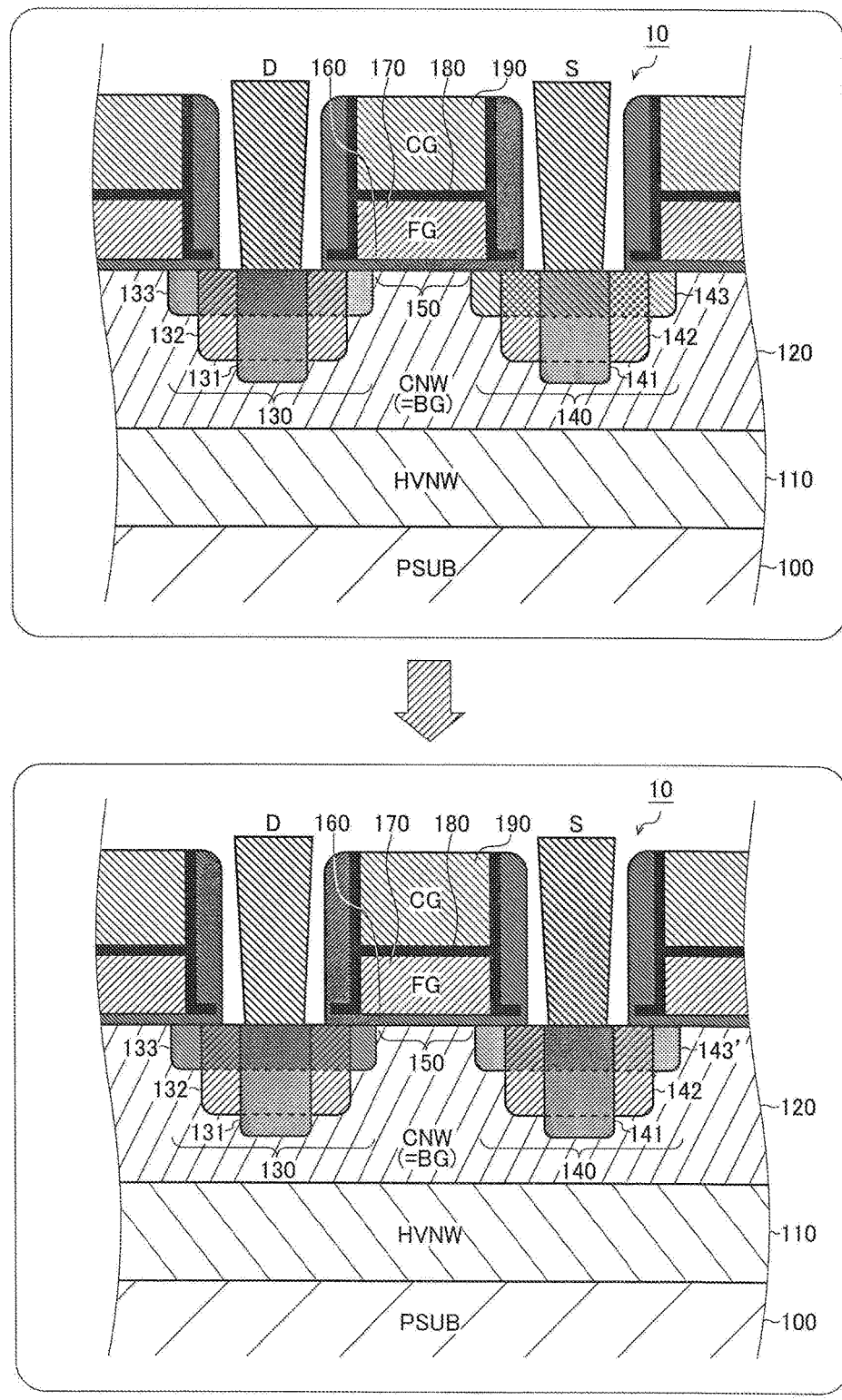
FIG. 7 is a vertical cross-sectional view illustrating a second structural example of the memory cell.

Next, reduction of mask layers when manufacturing the memory cell 10 is described with reference to FIGS. 6 to 8. FIGS. 6 to 8 are vertical cross-sectional views of the memory cell 10. Note that the upper part in each diagram illustrates the structure of the memory cell 10 driven by the conventional apply voltage control (see the left frame in FIG. 2), and the lower parts in the diagrams respectively illustrate the first to third structural example of the memory cell 10 driven by the new apply voltage control (see the right frame in FIG. 2).

As illustrated in each diagram, the memory cell 10 is a P-channel field-effect transistor formed in a p-type semiconductor substrate 100 (referred to as PSUB in the diagram), and includes an n-type high withstand voltage well 110 (referred to as HVNW in the diagram), an n-type cell well 120 (referred to as CNW in the diagram), a p-type drain area 130 and a source area 140, a channel area 150, a tunnel insulation film 160, a floating gate 170 (referred to as FG in the diagram), an oxide insulating film 180, and a control gate 190 (referred to as CG in the diagram).

The high withstand voltage well 110 is an n-type semiconductor area formed in the semiconductor substrate 100.

The cell well 120 is an n-type semiconductor area formed in the high withstand voltage well 110 and functions as the backgate BG of the memory cell 10.

The drain area 130 and the source area 140 are p-type semiconductor areas formed on the surface of the cell well 120 with a predetermined distance therebetween.

The channel area 150 is an area in which a p-type inversion layer appears near the surface of the cell well 120 between the drain area 130 and the source area 140.

The tunnel insulation film 160 is an insulator formed to cover the channel area 150 between the drain area 130 and the source area 140. The tunnel insulation film 160 can be formed of silicon oxide or the like, and its thickness is approximately 2.5 to 5 nm in general.

The floating gate 170 is a charge trap layer formed on the tunnel insulation film 160 and is electrically insulated from its surroundings. The floating gate 170 can be formed of silicon nitride or the like, and its thickness is approximately 10 nm in general.

The oxide insulating film 180 is an insulator formed on the floating gate 170. The oxide insulating film 180 can be formed of silicon oxide or the like, and its thickness is approximately 5 nm in general.

The control gate 190 is an electric conductor formed on the oxide insulating film 180 and can be formed of polysilicon, for example. In this way, the gate electrode of the memory cell 10 has a two-layer structure in which an oxide insulating film 180 is sandwiched between layers.

In the memory cell 10 driven by the conventional apply voltage control, as illustrated in the upper part in each diagram, three impurity diffusion layers 131 to 133 are laminated to form the drain area 130, and similarly three impurity diffusion layers 141 to 143 are laminated to form the source area 140.

Note that the impurity diffusion layers 131 and 141 correspond to contacts of the drain area 130 and the source area 140, respectively. These impurity diffusion layers 131 and 141 have the same impurity concentration, and hence they can be formed using a common mask layer.

In addition, the impurity diffusion layers 132 and 142 also have the same impurity concentration, and hence they can be formed using a common mask layer.

However, in the memory cell 10 driven by the conventional apply voltage control, it is necessary to avoid unintended charge injection (i.e. miswriting) from the source area 140 to the floating gate 170 while reducing the voltage between backgate and source. Therefore, it is necessary to form in the source area 140 the impurity diffusion layer 143 having a lower concentration than the impurity diffusion layer 133 in the drain area 130. Therefore the impurity diffusion layers 133 and 143 have different impurity concentrations, and hence they cannot be formed using a common mask layer.

Therefore the step of forming the drain area 130 and the source area 140 needs at least (1) a mask layer for forming the impurity diffusion layers 131 and 141, (2) a mask layer for forming the impurity diffusion layers 132 and 142, (3) a mask layer for forming the impurity diffusion layer 133, and (4) a mask layer for forming the impurity diffusion layer 143.

On the other hand, in the memory cell 10 driven by the new apply voltage control, the above-mentioned reduction of the voltage between backgate and source is not necessary. Therefore as illustrated in the lower part in FIG. 6, for example, the impurity diffusion layer 143 in the source area 140 can be eliminated, and hence the mask layer for one step can be reduced compared with the conventional structure.

In addition, for example, as illustrated in the lower part in FIG. 7, instead of the impurity diffusion layer 143 having a lower concentration than the impurity diffusion layer 133, an impurity diffusion layer 143' having the same concentration as the impurity diffusion layer 133 may be formed in the source area 140. These impurity diffusion layers 133 and 143' have the same impurity concentration, and hence they can be formed using a common mask layer. Therefore, similarly to the case where the impurity diffusion layer 143 is eliminated, the mask layer for one step can be reduced compared with the conventional structure.

In addition, when forming in the source area 140 the impurity diffusion layer 143' having the same concentration as the impurity diffusion layer 133, as illustrated in the lower part in FIG. 8, for example, the impurity diffusion layers 132 and 142 can be eliminated in the drain area 130 and the source area 140, respectively. Therefore the mask layers for two steps can be reduced compared with the conventional structure.

Further, when the new structure of the memory cell 10 (i.e. the lower part in each diagram) is noted, unlike the conventional structure (i.e. the upper part in each diagram), the source area 140 can be said to have a structure without the impurity diffusion layer having a concentration different from that of the drain area 130, in other words, a structure that can be formed using a common mask layer with the drain area 130. However, it is optional to adopt the conventional structure (i.e. the upper part in each diagram) for the memory cell 10 driven by the new apply voltage control.

<Reduction of Area>

In the above description, it is mentioned that the area of the nonvolatile semiconductor storage device 1 can be reduced by improvement of programming operation in the memory control circuit 20 (i.e. new apply voltage control), through reduction of mask layers in the memory cell 10, reduction of high withstand voltage elements in the memory control circuit 20, reduction of regulators (VPL_REG) in the power supply circuit 30, and the like. However, in order to achieve further cost reduction and improvement of convenience of the nonvolatile semiconductor storage device 1, it is required to further promote the reduction of area.

Note that in order to achieve further reduction of area of the nonvolatile semiconductor storage device 1, it is important to reduce a ratio of the high withstand voltage elements HV having large restriction in layout inside the power supply circuit 30. For this reason, it is desired, for example, to review voltage restriction of the regulator included in the power supply circuit 30, to prevent overvoltage of an element above its withstand voltage, and thus to increase medium withstand voltage elements MV as much as possible while reducing high withstand voltage elements HV.

In addition, it is required to optimize the layout of the memory cell 10, the memory control circuit 20, the power supply circuit 30, and the logic circuit 40 so as to reduce the wiring area.

<Summary>

In the following description, various embodiments disclosed in this specification are summarized.

The nonvolatile semiconductor storage device disclosed in this specification includes a floating-gate memory cell, and a memory control circuit arranged to control the memory cell, in which the memory control circuit sets a backgate and a source of the memory cell to the same potential in programming operation of the memory cell (first structure).

Note that in the nonvolatile semiconductor storage device having the first structure, it is preferred to adopt a structure in which the memory control circuit short-circuits the backgate and the source of the memory cell in the programming operation of the memory cell (second structure).

In addition, in the nonvolatile semiconductor storage device having the first or second structure, it is preferred to adopt a structure in which the memory control circuit switches the source of the memory cell to a floating state from the state being set to the same potential as the backgate in the programming operation of the memory cell (third structure).

In addition, in the nonvolatile semiconductor storage device having any one of the first to third structures, it is preferred to adopt a structure in which the memory control circuit sets the backgate and the source to a first voltage, sets a drain to a second voltage lower than the first voltage, and sets a control gate to a third voltage higher than the first voltage, in a predetermined selected memory cell among a plurality of memory cells (fourth structure).

In addition, in the nonvolatile semiconductor storage device having the fourth structure, it is preferred to adopt a structure in which the memory control circuit sets the backgate and the source to the first voltage, and sets the drain and the control gate to the second voltage, in a nonselected memory cell connected to the same bit line as the selected memory cell among the plurality of memory cells (fifth structure).

In addition, in the nonvolatile semiconductor storage device having the fourth or fifth structure, it is preferred to adopt a structure in which the memory control circuit sets the backgate and the source to the first voltage, sets the control gate to the third voltage, and sets the drain to the floating state, in a nonselected memory cell connected to the same word line as the selected memory cell among the plurality of memory cells (sixth structure).

In addition, in the nonvolatile semiconductor storage device having any one of the fourth to sixth structures, it is preferred to adopt a structure in which the memory control circuit sets the first voltage to 1.5 V, sets the second voltage to −3 V, and sets the third voltage to 3 to 8 V (seventh structure).

In addition, in the nonvolatile semiconductor storage device having any one of the first to seventh structures, it is preferred to adopt a structure in which the memory cell is a field-effect transistor including a cell well that functions as the backgate, a drain area and a source area formed on a surface of the cell well, a tunnel insulation film formed on a channel area on the surface of the cell well, a floating gate formed on the tunnel insulation film, an oxide insulating film formed on the floating gate, and the control gate formed on the oxide insulating film (eighth structure).

In addition, in the nonvolatile semiconductor storage device having the eighth structure, it is preferred to adopt a structure in which the source area does not include an impurity diffusion layer having a concentration different from that of the drain area (ninth structure).

In addition, a memory control method disclosed in this specification is a method for controlling a floating-gate memory cell forming a nonvolatile semiconductor storage device. The memory control method includes setting a backgate and a source of the memory cell to the same potential in programming operation of the memory cell (tenth structure).

According the invention disclosed in this specification, it is possible to provide a nonvolatile semiconductor storage device capable of preventing miswriting in the nonselected memory cell.

<Other Variations>

Note that various technical features disclosed in this specification can be modified variously other than the embodiments described above without deviating from the concept of the technical invention. In other words, the embodiments are merely examples in every aspect and should not be interpreted as limitations. The technical scope of the present invention is not limited to the embodiments described above and should be understood to include all modifications within meaning and scope equivalent to the claims.

INDUSTRIAL APPLICABILITY

The nonvolatile semiconductor storage device disclosed in this specification can be used as a storage medium for various electronic devices (such as a smart phone, a tablet computer, a digital still camera, a digital video camera, a digital audio player, a gaming device, and a personal computer), and its forms of use include a universal serial bus (USB) memory, various memory cards, a flash solid state drive (SSD), and a memory storing basic input/output system (BIOS).

What is claimed is:

1. A nonvolatile semiconductor storage device comprising:
   a floating-gate memory cell; and
   a memory control circuit arranged to control the memory cell, wherein
   the memory control circuit sets a backgate and a source of the memory cell to the same potential in programming operation of the memory cell,
   wherein the memory control circuit sets the backgate and the source to a first voltage, sets a drain to a second voltage lower than the first voltage, and sets a control gate to a third voltage higher than the first voltage, in a predetermined selected memory cell among a plurality of memory cells,
   wherein the memory control circuit sets the backgate and the source to the first voltage, and sets the drain and the control gate to the second voltage, in a nonselected memory cell connected to the same bit line as the selected memory cell among the plurality of memory cells.

2. The nonvolatile semiconductor storage device according to claim 1, wherein the memory control circuit short-circuits the backgate and the source of the memory cell in the programming operation of the memory cell.

3. The nonvolatile semiconductor storage device according to claim 1, wherein the memory control circuit switches the source of the memory cell to a floating state from the state being set to the same potential as the backgate in the programming operation of the memory cell.

4. The nonvolatile semiconductor storage device according to claim 1, wherein the memory cell is a field-effect transistor including a cell well that functions as the backgate, a drain area and a source area formed on a surface of the cell well, a tunnel insulation film formed on a channel area on the surface of the cell well, a floating gate formed on the tunnel insulation film, an oxide insulating film formed on the floating gate, and the control gate formed on the oxide insulating film.

5. The nonvolatile semiconductor storage device according to claim 4, the source area does not include an impurity diffusion layer having a concentration different from that of the drain area.

6. A nonvolatile semiconductor storage device comprising:
   a floating-gate memory cell; and
   a memory control circuit arranged to control the memory cell, wherein
   the memory control circuit sets a backgate and a source of the memory cell to the same potential in programming operation of the memory cell,
   wherein the memory control circuit sets the backgate and the source to a first voltage, sets a drain to a second voltage lower than the first voltage, and sets a control gate to a third voltage higher than the first voltage, in a predetermined selected memory cell among a plurality of memory cells,
   wherein the memory control circuit sets the backgate and the source to the first voltage, sets the control gate to the third voltage, and sets the drain to the floating state, in a nonselected memory cell connected to the same word line as the selected memory cell among the plurality of memory cells.

7. The nonvolatile semiconductor storage device according to claim 6, wherein the memory control circuit short-circuits the backgate and the source of the memory cell in the programming operation of the memory cell.

8. The nonvolatile semiconductor storage device according to claim 6, wherein the memory control circuit switches the source of the memory cell to a floating state from the state being set to the same potential as the backgate in the programming operation of the memory cell.

9. The nonvolatile semiconductor storage device according to claim 6, wherein the memory cell is a field-effect transistor including a cell well that functions as the backgate, a drain area and a source area formed on a surface of the cell well, a tunnel insulation film formed on a channel area on the surface of the cell well, a floating gate formed on the tunnel insulation film, an oxide insulating film formed on the floating gate, and the control gate formed on the oxide insulating film.

10. The nonvolatile semiconductor storage device according to claim 9, the source area does not include an impurity diffusion layer having a concentration different from that of the drain area.

11. A nonvolatile semiconductor storage device comprising:
   a floating-gate memory cell; and
   a memory control circuit arranged to control the memory cell, wherein
   the memory control circuit sets a backgate and a source of the memory cell to the same potential in programming operation of the memory cell,
   wherein the memory control circuit sets the backgate and the source to a first voltage, sets a drain to a second voltage lower than the first voltage, and sets a control gate to a third voltage higher than the first voltage, in a predetermined selected memory cell among a plurality of memory cells,
   wherein the memory control circuit sets the first voltage to 1.5 V, sets the second voltage to −3 V, and sets the third voltage to 3 to 8 V.

12. The nonvolatile semiconductor storage device according to claim 11, wherein the memory control circuit short-circuits the backgate and the source of the memory cell in the programming operation of the memory cell.

13. The nonvolatile semiconductor storage device according to claim 11, wherein the memory control circuit switches the source of the memory cell to a floating state from the state being set to the same potential as the backgate in the programming operation of the memory cell.

14. The nonvolatile semiconductor storage device according to claim 11, wherein the memory cell is a field-effect transistor including a cell well that functions as the backgate, a drain area and a source area formed on a surface of the cell well, a tunnel insulation film formed on a channel area on the surface of the cell well, a floating gate formed on the tunnel insulation film, an oxide insulating film formed on the floating gate, and the control gate formed on the oxide insulating film.

15. The nonvolatile semiconductor storage device according to claim 14, the source area does not include an impurity diffusion layer having a concentration different from that of the drain area.

* * * * *